US008131486B2

(12) United States Patent
Leonard et al.

(10) Patent No.: US 8,131,486 B2
(45) Date of Patent: Mar. 6, 2012

(54) NETWORKED BATTERY MONITORS

(75) Inventors: Thomas J. Leonard, Wantage, NJ (US); George A. Pedersen, Hagerstown, MD (US); Edward M. Potempa, Pittstown, NJ (US); Allan J. Baum, Jr., Oak Ridge, NJ (US)

(73) Assignee: BTECH, Inc., Rockaway, NJ (US)

( * ) Notice: Subject to any disclaimer, the term of this patent is extended or adjusted under 35 U.S.C. 154(b) by 524 days.

(21) Appl. No.: 12/325,445

(22) Filed: Dec. 1, 2008

(65) Prior Publication Data

US 2009/0144001 A1 Jun. 4, 2009

Related U.S. Application Data

(60) Provisional application No. 60/991,452, filed on Nov. 30, 2007.

(51) Int. Cl.
*G01R 31/36* (2006.01)
*G06F 11/30* (2006.01)

(52) U.S. Cl. ............... 702/63; 702/64; 702/65; 702/182

(58) Field of Classification Search .............. 702/63–67, 702/121–123, 179–189
See application file for complete search history.

(56) References Cited

U.S. PATENT DOCUMENTS 5,047,722 A 9/1991 Wurst et al.
5,281,920 A 1/1994 Wurst
5,394,089 A 2/1995 Clegg
5,457,377 A 10/1995 Jonsson
5,546,003 A 8/1996 Noworolski et al.
5,666,040 A 9/1997 Bourbeau
5,744,932 A 4/1998 Kissel
5,821,757 A 10/1998 Alvarez
6,051,976 A 4/2000 Bertness
6,144,189 A * 11/2000 Rockenbauch ............... 320/166
6,275,161 B1 8/2001 Wan et al.
6,677,759 B2 1/2004 Friel et al.
6,765,388 B1 7/2004 Clegg (Continued)

FOREIGN PATENT DOCUMENTS

JP 2003-123847 * 4/2003

(Continued)

OTHER PUBLICATIONS

"New battery monitor from PowerSmart", Copyright Seven Mountains Scientific, Inc. Dec. 2000, BNET.com (Lasted viewed Nov. 13, 2008).

(Continued)

*Primary Examiner* — Phuong Huynh
(74) *Attorney, Agent, or Firm* — Mark Nowotarski

(57) ABSTRACT

A battery monitoring system for simultaneously managing the batteries in 100 or more remote locations, each with 100 or fewer cells, has an individual battery monitor operatively engaged with at least one of the cells, a network access module in communication with the battery monitor, and a battery manager that has a fixed IP address that can be connected via an M2M data protocol to the battery monitor. The network access module is programmed to periodically transfer battery monitor data, including ohmic measurements, to the battery manager at a frequency of not less than once per week and with a total rate of data transfer of not more than 1 Mb per month. When the network access module initiates contact with the battery manager, the M2M data communication protocol assigns a variable IP address to the modem of the network access module.

5 Claims, 1 Drawing Sheet

U.S. PATENT DOCUMENTS

| | | | | |
|---|---|---|---|---|
| 7,003,431 | B2 | 2/2006 | Quint et al. | |
| 7,027,808 | B2 | 4/2006 | Wesby | |
| 7,061,246 | B2 | 6/2006 | Dougherty | |
| 7,206,704 | B2 | 4/2007 | Quint et al. | |
| 7,218,078 | B2 | 5/2007 | Gagnon et al. | |
| 7,277,889 | B2 | 10/2007 | Addonisio et al. | |
| 7,349,816 | B2 | 3/2008 | Quint et al. | |
| 2005/0149280 | A1 | 7/2005 | Sharma et al. | |
| 2005/0162172 | A1 * | 7/2005 | Bertness | 324/426 |
| 2006/0152224 | A1 * | 7/2006 | Kim et al. | 324/430 |
| 2006/0284619 | A1 | 12/2006 | Quint et al. | |
| 2007/0290887 | A1 | 12/2007 | Pleasanton | |

FOREIGN PATENT DOCUMENTS

| | | | |
|---|---|---|---|
| JP | 2003123847 | A | 4/2003 |
| JP | 2003282149 | A | 10/2003 |
| WO | WO 03/047064 | * | 6/2003 |
| WO | WO 03/047064 | A2 | 6/2003 |
| WO | WO 2005/078673 | * | 8/2005 |
| WO | WO 2005/078673 | A1 | 8/2005 |

OTHER PUBLICATIONS

"Battery monitoring poised for take off", Viewpoint, Batteries International, Spring 2007, pp. 34-38, www.batteriesinternational.com.

"BFAS Homepage" http://web.archive.org/web/20041010141520/bfas.net/specifications.html, (last viewed Nov. 14, 2008).

"General Packet Radio Service", Wikipedia, (last viewed Nov. 10, 2008).

Jonathan Quint "Battery Testing: Internal vs. Outsourced", Power Points Article from Battery Corp, http://www.internetviz-newsletters.com/batterycorp, (last viewed Aug. 9, 2005).

"212-AN-2 Application Note KORE Wireless GPRS Data Flow Overview", Copyright © 2006 KORE Wireless.

"214-99-2 Application Note Designing and Optimizing your GPRS Service", Copyright © 2006 KORE Wireless.

"Microchip Targets Smaller Mobile Devices with PowerSmart Battery Monitor", Embedded Star Jan. 27, 2004, http://www.embeddedstar.com/press/content/2004/1/embedded12560.html, (Last viewed Nov. 13, 2008).

"MicroGuard Standby Battery Monitor" LEM Feb. 10, 2006.

"Cellguard Wireless Battery Monitoring System", Copyright 2008 Midtronics.

"Cellguard System Conductance Based Battery Monitoring Solution", Copyright 2007 Midtronics, Inc. MK070139.

"Battery quality diagnostic tester IBEX-1000", Powertron Engineering Co. LTD, Copyright 2005 http://www.powertron.co.kr/english/prdt02.html (last viewed Nov. 14, 2008).

"Intelligent Power Qualtiy Monitoring System IPQMS/BDS", Powertron Engineering Co. LTD, Copyright 2005 http://www.powertron.co.kr/english/prdt03.html, (last viewed Nov. 14, 2008).

"Sentinel Intelligent Battery Transducer Impedance, Voltage and Temperature measurements", LEM 071112/0, Nov. 12, 2007.

"Description of Operation" , LEM, http://www.lem.com/hq/en/content/view/274/212/ (last viewed Nov. 17, 2008).

"Smart Shunt Battery Monitor", PowerSmart PS3180 SmartShunt™ Data Sheet Preliminary, Copyright PowerSmart Inc, , 2000. www.powersmart.com.

Kenneth A. Smith, "The High Cost of Maintaining Your VRLA Batteries / The High Cost of Not Maintaining Your VRLA Batteries" PECO II Inc., Columbus, OH, Nov. 16, 2006.

"Standby Battery Management for Critical systems", LEM Apr. 3, 2005.

"Market Line Card, Transit Bus" , Vanner, TS-16949/ISO 9001 Registered, 4282 Reynolds Drive • Hilliard, Ohio 43026, Jan. 29, 2008.

"Battery Failure Alarm Systems", BFAS Homepage, http://web.archive.org/web/20050212151029/, Feb. 12, 2005.

"BatteryCorp's New Web-Based Service Enables Carriers to Comply with Recent FCC Challenge", Newton, Mass.—BatteryCorp Inc., Copyright 2007 Business Wire, Copyright 2008 Gale, Cengage Learning.

Karim Nice, "How Diesel Locomotives Work", http://science.howstuffworks.com/diesel-locomotive.htm/printable (Last viewed Nov. 19, 2008).

"Smart Services for Mobile Assets", Feb. 18, 2008, http://www.specialtypub.com/printarticle.asp?SECTION=1&ARTICLE_ID=6516 (last viewed Dec. 18, 2008).

"Say 'All Aboard!' to Wireless—offering locomotive telemetry to railroads", Copyright 2007 Kore Telematics.

* cited by examiner

NETWORKED BATTERY MONITORS

CROSS REFERENCE TO RELATED APPLICATIONS

This application claims priority to U.S. provisional patent application entitled "Networked Battery Monitors", Ser. No. 60/991,452 filed on Nov. 30, 2007. Said provisional application is incorporated herein by reference.

TECHNICAL FIELD

This invention is in the field of battery monitoring

BACKGROUND ART

Batteries comprising multiple cells in series and parallel are the primary source of energy in most standby power systems. The individual cells in these systems are commonly 2V lead acid VRLA cells. The cells are connected in series called a "battery string" in order to achieve the desired total voltage. A remote cell phone tower, for example, might have 24 cells connected in series to provide a 48V DC power supply. A centralized phone exchange (PBX) or Internet service provider (ISP) might have 240 cells in a string to provide 480 V power.

In order to establish the viability of a lead acid battery to deliver power when required, it is necessary to routinely collect data in respect of voltage, temperature and ohmic measurements (e.g. ohmic resistance, impedance or conductance) of the individual cells/blocks of the battery. By trending the data collected over time, it is possible to establish the point at which a change in the data represents a loss of capacity that will impact the ability of the battery to support the load for the designated period of time.

The data is either collected manually on a regular schedule, typically every three months using a portable battery tester, or it is collected on a more frequent basis using a permanently installed monitoring system.

Limited resources at many organizations make the collecting and trending of battery data manually from remote sites impractical. On the other hand, the installation of standalone battery monitors is not considered to be cost effective due to the relatively high cost of the monitors relative to the cost of the batteries. Hence there is a long felt need for a cost effective system to monitor relatively large numbers of relatively small battery strings dispersed over a wide geographic area.

DISCLOSURE OF INVENTION

The Disclosure of Invention is provided as a guide to understanding the invention. It does not necessarily describe the most generic embodiment of the invention or all species of the invention disclosed herein.

Referring to FIG. 1, this invention relates to hardware and software that allows the collection, management, and interpretation of data from multiple geographically separated battery systems 110, 140, 150, 160 to be integrated on a single hardware platform at a central location 130 reducing the cost of implementing a permanent monitoring system.

The system utilizes standalone network access modules 118, 158 that can be interconnected 120, 170 using a network protocol. The modules collect data from the individual cells 114, 154 or blocks that make up a battery. Because the individual modules are isolated from the other modules, it is possible to monitor multiple batteries with separate charging systems on a single network. The control of each module and the analysis of the data collected is the function of a Battery Network Controller 130 installed at a centralized location with each module being polled at a regular interval.

For remote locations with a relatively small number of cells (e.g. less than 100), individual battery monitors 116 may be operatively engaged with their respective cells. "Operatively engaged" may include being located on or adjacent to each battery cell or block and connected to the positive and negative terminals of the respective cell or block. Each one of the individual battery monitors is capable of measuring and recording the voltage, temperature, and an ohmic measurement of the individual cells or blocks to which it is connected. The individual battery monitors may make ohmic measurements using induced perturbations or background perturbations (e.g. ripple current and/or voltage) of a given cell or string.

Additional ancillary modules that collect data, such as overall battery string voltage, battery current, ambient temperature, humidity, hydrogen gas detection (for safety purposes), and equipment alarms, can also be installed to provide additional data for analysis.

Each monitor is interconnected to the next monitor with a series bus to create a sub network of monitors.

Any number of individual battery systems can be monitored on each sub network providing the length of the interconnect cable linking the modules on separate battery systems is within acceptable limits for serial communications.

The communication networks over which the Battery Network Controller can communicate with a battery sub network include:

- PSTN using a dial up modem (not shown)
- Commercial Wireless network 120, 170 using a cellular modem
- TCP/IP over the Internet (not shown)
- TCP/IP over an Intranet (not shown)

At each sub network location a Network Access Module configured for the transport medium selected will provide the interface between the sub network bus protocol and the Battery Network Controller.

The function of the Battery Network Controller is to be the network manager for a defined number of battery sub networks and to poll each module in the battery sub networks at a specified frequency to collect the data and store it in a database.

For each sub network to be monitored, the Battery Network Controller will have a configuration file which will map the module address within the sub network with the Battery ID, the Battery String ID, and the Cell ID within the string. This will allow the data collected to be correctly identified when saved in the database.

Modules other than battery monitoring modules will also be identified by the type of module and the module address so that the data collected can be saved in the correct location within the database.

A configuration file will contain general alarm limits for Cell Voltage, Cell Temperature, and Impedance. If there are optional modules installed, the configuration file will also contain the alarm limits for these modules.

The Battery Network Controller will compare each value as it is collected and generate an alarm log which will contain the identifier of the cell or block that is out of tolerance, the value recorded, and the limit value against which it was compared.

Relay contacts which can be associated with specific alarm conditions are available to generate local alarms at the location of the Battery Network Controller to alert personnel 131 to take appropriate action, such as the dispatching of service vehicle 111.

Remote notification of unacknowledged alarms can be sent to pre designated parties. These alarms may be reported using Email, SMS, and Pager.

After every scheduled collection of impedance data, the stored data may be analyzed and used to generate the following reports:

Assessed Risk:

Estimated loss of capacity on a per string basis

Risk of failure at 25%, 50%, 75%, and 100% of designed run time

Estimate of when the battery will require replacement

Identified Problems:

Cells/Blocks operating outside pre established limits

Environmental conditions outside predetermined limits

A web server may be incorporated into the Battery Network Controller. The reports may then be made available on web pages created for each sub network. A web page with a map showing the physical locations of the sub networks and individual cells within a remote location shall act as a quick index to the individual sites.

The Battery Network Controller may also execute requests for data from its databases and make that data available for interpretation by external programs.

MODES FOR CARRYING OUT INVENTION

Figure 1:
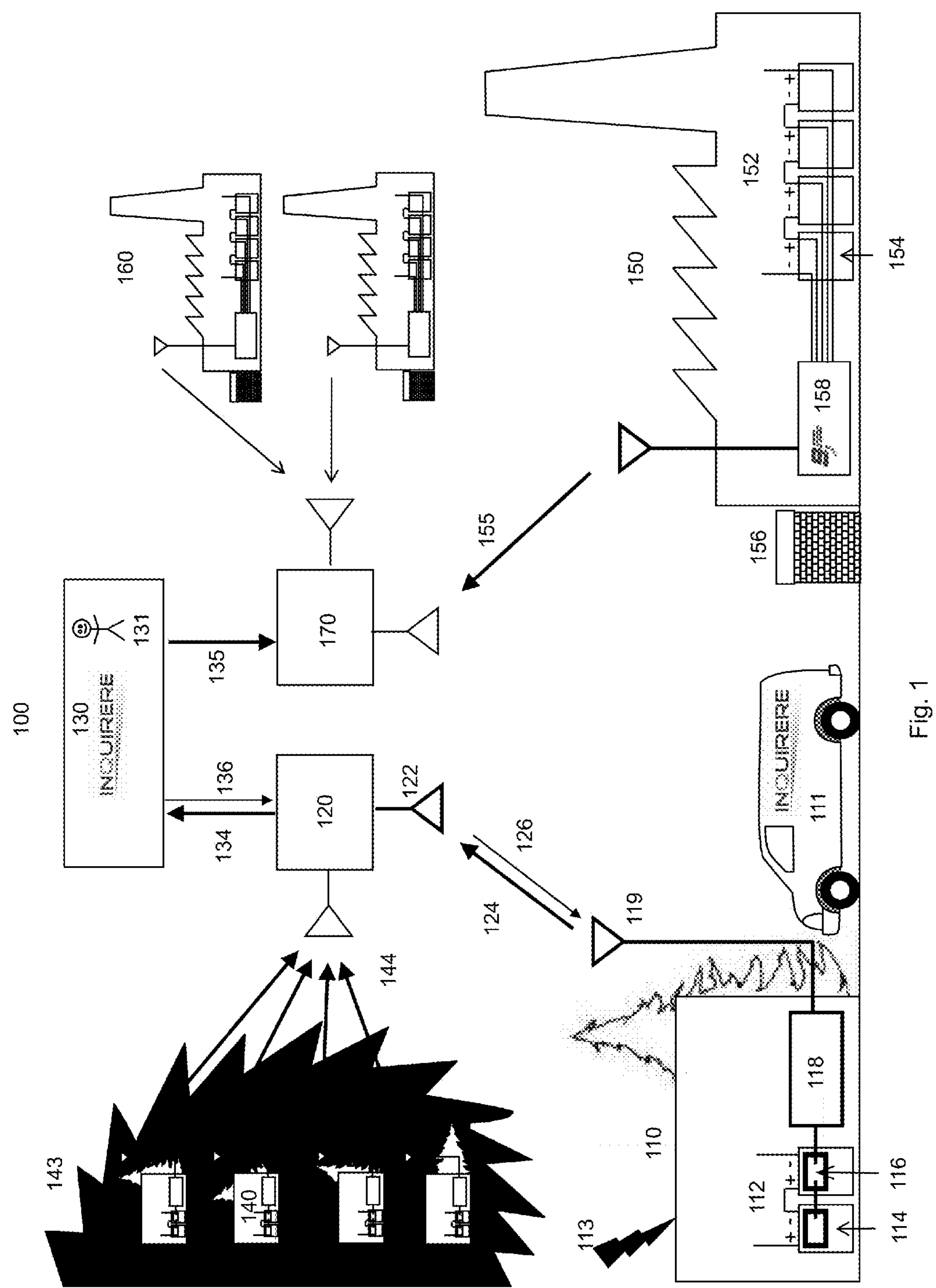
FIG. 1 is an illustration of an exemplary networked battery monitor.

The following detailed description discloses various embodiments and features of the invention. These embodiments and features are meant to be exemplary and not limiting.

A networked battery monitor suitable for managing a widely dispersed set of batteries is illustrated in FIG. 1. FIG. 1 shows a remote location 110 with a monitored battery string 112 in communication with a battery management service 130 via a wireless telecom provider 120. FIG. 1 also shows an industrial installation 150 with a large battery string 152 also in communication with said battery management service via an alternative wireless telecom provider 170. The system may also include remote locations in communication with the battery management service via internet or other land line systems (not shown).

The battery string in the remote location has a relatively small number of cells (e.g. 1 to 100). Each of these cells has an associated individual battery monitor 116. The individual battery monitors periodically measure the voltage, temperature, impedance (or conductance) and current of each cell. The modules on all of the cells are in communication with a network access module 118. The network access module records the data measured by the individual battery monitors, stores it, and periodically transmits the data to the battery management service.

A suitable individual battery monitor is the LEM Sentinel made by LEM HEME of Geneva, Switzerland. For relatively small numbers of cells (e.g. less than 100), the LEM Sentinel provides cost effective monitoring since each Sentinel costs about 1/10 of the cost of a cell and they have comparable service life times. Centralized battery monitors that are multiplexed to the individual cells, such as the Btech S5 made by Btech of Rockaway N.J., are more cost effective on a per cell basis for battery strings with a large numbers of cells.

Cost Effective Telecommunications

Tracking the batteries in a large number (e.g. +100) of geographically remote locations can be difficult from a telecommunications cost standpoint. Internet access and even cell phone access may be cost prohibitive due to the high fixed monthly fees relative to the cost of the monitoring equipment. It has been surprisingly found, however, that "pay per megabyte" M2M ("machine to machine") telecommunications systems, such as the GPRS service provided by KORE Telematics of Reston Va., can provide adequate service at reasonable costs if the battery monitoring protocol is designed appropriately.

The challenge we discovered is that the overhead data requirements of remote GPRS communications of battery related data are fairly high. The ratio of data overhead (e.g. addresses, flags, checksums etc.) to battery data (e.g. voltage, cell ID, impedance, etc.) ranged from 5:1 to 50:1 for two cell systems that we monitored. Typically about 300 bytes of battery data resulted in a "data charge" of 3,000 bytes.

A suitable protocol for a remote site, such as a cell phone tower with 24 VRLA cells providing 8 hours of backup power, is to transfer the battery data periodically at a rate of between twice per day to once per week. A once per day protocol, for example, results in a data charge of 90,000 bytes per month, or a data transfer cost of $5.63 per month assuming a fixed charge of $5 per month and a variable charge of $7 per Mb. This is an acceptable cost relative to the cost of the batteries.

An additional challenge in cost effective communications to remote battery sites, is developing an appropriate data transfer protocol to use during an "unscheduled event", such as a battery discharge during a loss of utility power such as by a local lightening strike 113. The battery manager 130 needs to monitor the discharge in "real time" but it cannot initiate a connection to the network access module in an M2M system where the remote locations are assigned variable IP addresses. The network access module must be programmed to anticipate when the battery manager is going to need to see data and how often that data needs to be updated. It can then initiate connections 124, 134 appropriately.

GPRS systems assign variable IP addresses to remote locations. As indicated in FIG. 1, in order for the battery manager 130 to communicate with the network access module 118 at a remote location, the module must initiate 124 the connection. The GPRS service assigns an IP address to the network controller and "completes the call" 134 with the manager. The manager can then transmit 136 a query which is transferred 126 to through the appropriate wireless antennas 122, 119 to the network access module. Certain acknowledgements might be sent to verify that the proper connections are made. The module then responds with the requested data and the connection is terminated. By "terminated connection" it is meant that the dynamic IP address that had been assigned to the network access module is no longer so assigned. Our tests have shown that connections might last from 20 seconds to two minutes.

A suitable protocol for remote locations is to have the network access module initiate a connection every 5 to 20 minutes during a battery discharge event and download a snap shot of the cell voltages, string current, etc. at that time. 5 to 20 minutes is an acceptable time delay for a battery manager. The time resolution can be higher than the delay by having the network access module store a set of readings taken at a higher frequency, such as once every minute. The network access module then transmits the entire high resolution data set at the end of the discharge event. This helps reduce the ratio of data overhead to battery data. A data charge of about 0.3 Mb per discharge event would be incurred, therefore, for data transfer connections made every 5 minutes during an 8 hour battery discharge. The battery manager would know within 5 minutes of a cell failure. A service call could then be initiated.

Another challenge faced by a battery manger is the simultaneous discharge of a large number of batteries in different remote sites 140 in the event of a widespread catastrophe, such as a large area blackout or hurricane 143. All of the sites will be attempting to initiate connections 144 at about the same time. A solution to this problem is to have threads available in the manager system to handle multiple sites at the same time. 10 to 100 threads might be suitable. A large input buffer should also be provided to queue up incoming site information if more sites than the number of threads are attempting to report in at the same time.

Yet another challenge is scheduling when the remote sites should make their scheduled periodic downloads. Rather than try to keep track of who should call in when, each network access module can be given the instructions to call in at the same time plus or minus a certain random time. The appropriate random time will be a function of the number of sites, the number of threads available, and the typical call length.

Large Sites

The same Battery Manager can simultaneously monitor a relatively smaller number 160 of larger sites 150 that each has battery strings 152 with a fairly large number of cells (e.g. 240 cells for a 480V stack). Battery monitoring, including ohmic measurements, can be done by a centralized monitor 158.

One of the challenges of a large site, however, is that the site owner may not allow the battery manager internet access through the site's firewall 155. Here again, wireless communication can be used.

With large sites, a conventional "cell phone" services (e.g. 170) with a fixed IP address for the site, can be cost effective even though it has relatively high fixed monthly service charge. An advantage of the fixed IP address is both the battery manager and the battery monitor can initiate contact 135, 155.

CONCLUSION

While the disclosure has been described with reference to one or more different exemplary embodiments, it will be understood by those skilled in the art that various changes may be made and equivalents may be substituted for elements thereof without departing from the scope of the disclosure. In addition, many modifications may be made to adapt to a particular situation without departing from the essential scope or teachings thereof. Therefore, it is intended that the disclosure not be limited to the particular embodiment disclosed as the best mode contemplated for carrying out this invention.

We claim:

1. A battery monitoring system for simultaneously managing the batteries in 100 or more remote locations, each of said locations comprising a battery string with 100 or fewer cells, said system comprising:

a. an individual battery monitor operatively engaged with at least one of said cells;

b. a network access module in communication with said battery monitor, said network access module comprising a modem compatible with a machine-to-machine data communication protocol, said protocol comprising assigning a variable IP address to said network access module modem upon initiation of a connection to a battery manager; and c. said battery manager comprising a fixed IP address that can be connected to via said a machine-to-machine data protocol upon said initiation of said connection, wherein said network access module is programmed to periodically transfer battery monitor data, including ohmic measurements, to said battery manager at a frequency of not less than once per week and with a total rate of data transfer of not more than 1 Mb per month.

2. The battery monitoring system of claim 1 where which further comprises at least 100 of said network access modules, each located at a different remote location and each being programmed to call in at a scheduled time plus or minus a random offset in time.

3. The battery monitoring system of claim 1 wherein said network monitor is programmed to initiate a connection and download cell ohmic measurement data at a rate of between once per minute and once per 5 minutes during a battery discharge.

4. The battery monitoring system of claim 1 wherein said individual battery monitor measures ohmic measurement data at least in part using background perturbations.

5. The battery monitoring system of claim 4 wherein said background perturbations comprise ripple current of said battery string.

* * * * *